(12) United States Patent
Martens

(10) Patent No.: US 6,665,628 B2
(45) Date of Patent: Dec. 16, 2003

(54) METHODS FOR EMBEDDING AND DE-EMBEDDING BALANCED NETWORKS

(75) Inventor: Jon S. Martens, San Jose, CA (US)

(73) Assignee: Anritsu Company, Morgan Hill, CA (US)

( * ) Notice: Subject to any disclaimer, the term of this patent is extended or adjusted under 35 U.S.C. 154(b) by 122 days.

(21) Appl. No.: 10/050,283

(22) Filed: Jan. 15, 2002

(65) Prior Publication Data

US 2003/0135344 A1 Jul. 17, 2003

(51) Int. Cl.[7] .......................... G01R 27/28; G01R 35/00
(52) U.S. Cl. .................. 702/117; 702/85; 324/73.1; 324/601; 324/637; 324/638; 714/733; 714/734
(58) Field of Search .................. 702/85, 117; 324/73.1, 324/601, 637, 638; 714/733, 734, 735, 736, 737, 738

(56) References Cited

U.S. PATENT DOCUMENTS

| | | | |
|---|---|---|---|
| 5,578,932 A | 11/1996 | Adamian | ..................... 324/601 |
| 5,784,299 A | * 7/1998 | Evers et al. | ................... 702/85 |
| 6,188,968 B1 | 2/2001 | Blackham | ..................... 702/85 |

OTHER PUBLICATIONS

Anritsu Model 360B Vector Network Analyzer, Operation Manual, Revision: F, Oct., 1997, Chapters 3, 4, 5, 6, 7, 8 and 9, pp. 3–4 to 9–46.
Application Note, Anritsu, Relfectometer Measurements–Revisited, Apr., 2000, Rev. C, 12 pages.
Bauer, R.F.; Penfield, Jr., P., "De–Embedding and Unterminating", IEEE Transactions Of Microwave Theory and Technique, vol. MTT–22, No. 3, Mar. 1974, pp. 282–288.
Daywitt, W.C., "Determining Adapter Efficiency by Envelope Averaging Swept Frequency Reflection Data", IEEE Transactions on Microwave Theory and Techniques, vol. 38, No. 11, Nov. 1990, pp. 1748–1752.
Eberly, Mike; Dunleavy, L., "Intro to the Agilent 8714–RF Network Analyzer", Agilent Technologies, EducatorsCorner.com Experiments, 7 pages.

(List continued on next page.)

*Primary Examiner*—John Barlow
*Assistant Examiner*—Meagan S. Walling
(74) *Attorney, Agent, or Firm*—Fliesler Dubb Meyer & Lovejoy, LLP

(57) ABSTRACT

Methods are provided for virtually embedding and/or de-embedding balanced four-port networks into/from a device under test (DUT). For the methods, a set of scattering-parameters is acquired for the DUT. Additionally, a respective set of scatter-parameters is acquired for each of the balanced four-port networks to be embedded and/or de-embedded. A transfer-matrix is generating for the DUT based on its scattering parameters. Further, a respective transfer-matrix is generated for each of the networks to be embedded/de-embedded based on its respective set of scattering-parameters. The transfer-matrix for the DUT is then multiplied with the one or more transfer-matrices associated with the balanced four-port networks to be embedded and/or by an inverse of the transfer-matrices associated with the balanced four-port networks to be de-embedded. A composite transfer-matrix is thereby produced. Finally, a set of composite scattering-parameters is then generated based on the composite transfer-matrix. The set of composite scattering-parameters is representative of the DUT with the one or more balanced four-port networks embedded into it and/or the one or more balanced four-port networks de-embedded from it.

29 Claims, 12 Drawing Sheets

OTHER PUBLICATIONS

Edwards, M.L., "Calibration and Measurements of S-Parameters", *Microwave & RF Circuits: Analysis, Design, Fabrication & Measurement*, Chapter 7, Sep. 7, 2001, 23 pages.

Fay, P. "Error Correction For Network Analysis–Lab #5", Microwave Circuit Design and Measurments Lab, EE 458/558, Reviesd Sep. 2001, 3 pages.

Glasser, L.A., "An Analysis of Microwave De–embedding Errors", IEEE Transactions on Microwave Theory and Techniques, vol. NTT–26, No. 5, May 1978, pp. 379–380.

Gonzalez, Ph.D., G., *Microwave Transistor Amplifiers Analysis and Design*, Prentice–Hall, Inc., New Jersey, Chapters 1 and 2, pp. 1–90.

King, J.D.; Biron, B., "Direct Characterization of Non–Insertable Microwave Test Fixtures For Packaged MMICs"; 57$^{th}$ ARFTG Dig, May 2001, pp. 19–27.

Matthew, P.J., Song, J.J., RF Impedance Measurement Calibration, Advances Photon Source, Argonne National Laboratory, Feb. 12, 1993, 16 pages, World Wide Web Page, URL+http://www.aps.anl.gov/techpub/lsnotes/ls223/ls223.html, visited Nov. 12, 2001.

Nelson, R., "What are S–kparameters, anyway?", Test & Measurement World, Feb. 2001, 9 pages, World Wide Web page, URL+http://://www.tmworld.com/articles/2001/02$_+$separmeters.htm, visited Nov. 13, 2001.

"Network Analyser Calibration", World Wide Web pages, URL+http://ww.morph/demon.co.uk/Electronics/new.htm, visited Nov. 13, 2001, 12 pages.

Pollard, R.D., Lane, R.Q., "The Calibration Of A Universal Test Fixture", 1983 MIT–S Digest, pp. 498–500.

Product Note, Aglient 8510–13, "Measuring Noninsertable Devies," Agilent Technologies, Aug. 1988, 15 pages.

Randa, J.l Wiatr W.; Billinger, R., "Comparison of Adapter Characterization Methoss," IEEE Trans. on MTT, vol. 47, Dec. 1999, pp. 2613–2620.

Silvonen, K., Calibration and De–Embedding of Microwave Measurements Using Any Combination of One–or Two–port Standards, Circuit Theory Laboartory CT–4, Dec. 1987, Helsinki University of Technology, 28 pages.

Tippet, J.C.; Speciale, R.A., "A Rigorous Technique for Measuring the Scatter Matrix of a Multiport Device with a 2–Port Network Analyzer," IEEE Transactions on Microwave Theory and Techniques, vol. MIT–20, No. 5, May 1992, pp. 661–666.

Vaitkus, R., Scheitlin, D., A Two–Tier Deembedding Technique For Packaged Transistors, 1982 IEEE–S Digest, pp. 328–330.

Wiatr, W., "A Method for Embedding Network Chatacterization with Application to Low–loss Measurements," IEE Transactions on Instrucments and Measrements, vol. 36, Jun. 1987, pp. 487–490.

Williams, D.F.; Walker, D.K., "In–Line Multiport Calbration Algorithm," Publication of the National Institute of Standards and Technology, Colorado, pp. 1–3.

Wiltron/Anritsu Company documentation for the 360B and 37xxx network analyzers, pp. 8–34 to 8–38.

* cited by examiner

Common-mode (in phase) input and common-mode output

Common-mode (in phase) input and differential (180 degrees out of phase) output

Differential input and common mode output

Differential input and differential output

METHODS FOR EMBEDDING AND DE-EMBEDDING BALANCED NETWORKS

BACKGROUND

1. Field of the Invention

The present invention relates to methods for virtually embedding and/or de-embedding balanced networks when, for example, making measurements using a vector network analyzer (VNA).

2. Description of the Related Art

Measurements of a device under test (DUT) using a VNA may not always be performed in a desired test environment. This is because it may be too time intensive and/or costly to measure a DUT in a desired test environment. Accordingly, a DUT is often measured in a different environment for reasons of expediency and/or practicality, thereby requiring the use of embedding or de-embedding techniques to correct the effects of the test environment. For example, a DUT may be in a test fixture or connected via wafer probes when measurements of the DUT are made, thereby requiring the removal of the effects of the fixture or probes from the measured data for a truer picture of actual DUT performance. De-embedding techniques allows this task (i.e., removal of effects) to be performed computationally. This concept is shown in FIG. 1A. In another example, a customer may desire to see what the performance of a DUT would be with a specific matching network attached. However it may be impractical to attach the matching network during manufacturing for cost reasons. Embedding techniques allow this task (i.e., attaching the matching network) to be performed computationally. This concept is shown in FIG. 1B.

For two port devices, a chain matrix or cascading computation using transfer matrices has been used to perform embedding and de-embedding. The concept is to re-arrange standard scattering-parameters (S-parameters) to form a pair of new matrices (termed T for transfer matrices) that can be multiplied for embedding and form the equivalent to the networks being concatenated or cascaded (i.e., one network being embedded). Multiplying by the inverse of the T-matrix (i.e., $T^{-1}$) is the equivalent of de-embedding. A key-point is that the outputs from one stage map directly to the inputs of the next stage thereby allowing the matrix multiplication to make sense.

Transfer-matrices (also known to as transmission matrices) are made up of T-parameters (also known as chain-scattering-parameters and scattering-transfer-parameters) that are defined in a manner analogous to S-parameters except the dependencies have been switched to enable the cascading discussed above. In both cases the wave variables are defined as $a_i$ for the wave incident on port i, and $b_i$ for the wave returning from port i. S-parameters of an n-port device characterize how the device interacts with signals presented to the various ports of the device. An exemplary S-parameter is "$S_{12}$." The first subscript number is the port that the signal is leaving, while the second is the port that the signal is being injected into. $S_{12}$, therefore, is the signal leaving port 1 relative to the signal being injected into port 2. Referring to FIG. 2, the incident and returning waves and the S-parameters are shown for an exemplary two port network 202. These S-parameters are defined by Equation 1 below.

$$\begin{bmatrix} b_1 \\ b_2 \end{bmatrix} = \begin{bmatrix} S_{11} & S_{12} \\ S_{21} & S_{22} \end{bmatrix} \begin{bmatrix} a_1 \\ a_2 \end{bmatrix} \quad \text{(Equation 1)}$$

where,
- $a_1$ is the traveling wave incident on port 1;
- $a_2$ is the traveling wave incident on port 2;
- $b_1$ is the traveling wave reflected from port 1;
- $b_2$ is the traveling wave reflected from port 2;
- $S_{11}$ is referred to as the "forward reflection" coefficient, which is the signal leaving port 1 relative to the signal being injected into port 1;
- $S_{21}$ is referred to as the "forward transmission" coefficient, which is the signal leaving port 2 relative to the signal being injected into port 1;
- $S_{22}$ is referred to as the "reverse reflection" coefficient, which is the signal leaving port 2 relative to the signal being injected into port 2; and
- $S_{12}$ is referred to as the "reverse transmission" coefficient, which is the signal leaving port 1 relative to the signal being injected into port 2.

(Note that the set of S-parameters $S_{11}, S_{12}, S_{21}, S_{22}$ make up an S-matrix)

The T-formulation is a bit different to allow for cascading. More specifically, in the T-formulation, $b_2$ and $a_2$ are independent parameters rather than $a_1$ and $a_2$ (as in the S-formulation of Equation 1). This does not change the operation of the circuit, just the situation under which the parameters are measured. Since T-parameters are rarely measured directly, this is usually not a concern. For a two port network, the T-parameters are defined in Equation 2 shown below.

$$\begin{bmatrix} a_1 \\ b_1 \end{bmatrix} = \begin{bmatrix} T_{11} & T_{12} \\ T_{21} & T_{22} \end{bmatrix} \begin{bmatrix} b_2 \\ a_2 \end{bmatrix} \quad \text{(Equation 2)}$$

Two cascaded two-port networks 302 and 304 are shown in FIG. 3. Note the arrangement is such that when two networks are connected together, $b_2$ of network 302 at the left maps directly onto $a_1$ for network 304 on the right. Similarly, $a_2$ for network 302 on the left maps directly onto $b_1$ for network 304 on the right.

The equations for computing the T-parameters in terms of the S-parameters (and vice versa) can be mathematically derived. The results are shown below in Equations 3 and 4.

$$\begin{bmatrix} T_{11} & T_{12} \\ T_{21} & T_{22} \end{bmatrix} = \frac{1}{S_{21}} \begin{bmatrix} 1 & -S_{22} \\ S_{11} & S_{21}S_{12} - S_{11}S_{22} \end{bmatrix} \quad \text{(Equation 3)}$$

$$\begin{bmatrix} S_{11} & S_{12} \\ S_{21} & S_{22} \end{bmatrix} = \frac{1}{T_{11}} \begin{bmatrix} T_{21} & T_{11}T_{22} - T_{21}T_{12} \\ 1 & -T_{12} \end{bmatrix} \quad \text{(Equation 4)}$$

To extend this methodology, consider an N-port DUT where the networks to be added or subtracted are still two ports. A simple extension for N-port embedding/de-embedding is shown in FIG. 4, which illustrates a six-port DUT 402 (i.e., N=6). Computationally, measurements for a six-port DUT 402 have conventionally been handled by treating the calibration coefficients associated with each port as a network and then multiplying the T-matrix for the "network" of the DUT with the T (or $T^{-1}$) matrices for "networks" 1–6 shown in FIG. 2. By reducing an N-port problem to a two-port concatination problem, the above discussed methodology has typically been adequate.

Recently, however, many circuits are being designed as balanced circuits. A balanced circuit, as defined herein, is a circuit that includes a pair of ports that are driven as a pair, with neither port of the pair being connected to ground. Examples of balanced circuits are circuits that have differential or common mode inputs. A balanced circuit need not be completely symmetrical. Balanced circuits have often been used in the pursuit of lower power consumption, smaller size, better electromagnetic interference (EMI) behavior and lower cost. This is especially true for consumer electronics. The behavior of the class of balanced devices are illustrated in FIGS. 5A–5D. In these FIGS., a four-port device 502 is treated as two pairs of ports (i.e., ports 1 and 2 making up one pair, and ports 3 and 4 making up another pair), where each pair may be driven either differentially or common mode. The outputs can also be measured in a differential or common-mode sense. FIG. 5A illustrates a common-mode (i.e., in-phase) input and a common mode output. FIG. 5B illustrates a common mode input and a differential (i.e., 180 degrees out of phase) output. FIG. 5C illustrates a differential input and a common mode output. FIG. 5D illustrates a differential input and a differential output.

While the methodology discussed with reference to FIG. 4 can be used for fixture de-embedding and certain other operations, there are occasions when this methodology is not adequate. FIG. 6 shows one example where a four-port matching network 602 that has different behaviors for differential and common-mode signals. Accordingly, such a balanced matching network 602 cannot be well represented by a two-port network. That is, the embedding of such a structure cannot be done using a simple two-port network. For example, if the matching network of FIG. 6 were broken down into two single ended networks (each with L/2 to ground), the common mode behavior of the actual matching network would not be simulated correctly. An example of this is illustrated in FIG. 7, which shows a graph having frequency along its horizontal axis and decibels (dB) along its vertical axis. Referring to FIG. 7, plotted line 702 illustrates the frequency response for network 602 when a differential input is applied, and plotted line 704 illustrates the frequency response of network 602 when a common mode input is applied. As can be seen from FIG. 7, network 602 has a different response for a differential input and a common mode input.

FIG. 8, which illustrates a circuit diagram 802 showing the differential equivalent of the circuit of FIG. 6, is useful for understanding why a simple breakdown into two port networks cannot be done. FIGS. 6 and 8 shall first be looked at when differential signals are applied. As can be appreciated looking at FIG. 8, when a differential drive is applied significant current will flow through each inductor L/2 to the virtual ground, thus substantially affecting the impedance seen at the ports. This would be expected from FIG. 6. However, looking at FIG. 6, if the drive was common-mode (i.e., in-phase) there should be no inductor current since the two inductor nodes will be at the same potential. If the voltage sources in FIG. 8 are however changed to both being +V (to represent common-mode), this circuit will still show massive inductor current flow indicating that this equivalent circuit is only valid for the differential drive condition. Accordingly, a four-port balanced circuit cannot be broken down into a pair of two-port circuits that provides equivalents in all cases.

While strict wave nodal analysis of balanced circuits maybe possible when two-port circuits do not provide equivalents, it may not be efficient for embedded and de-embedded system implementations. Accordingly, there is a need for an efficient method for embedding and de-embedding balanced circuits.

SUMMARY OF THE INVENTION

Embedding and de-embedding techniques have been existence for a number of years. However, the increasing importance of balanced and differential circuit design have produced a need for a change to the practice. This is because conventional embedding and de-embedding techniques have treated networks as two ports that can be added to or subtracted from any of the ports of the DUT. However, with balanced devices, the conventional techniques are not adequate since the ports of the DUT must often be considered two-at-a-time. The present invention provides a computational approach to embedding and de-embedding that more accurately simulates the behavior of balanced devices.

In accordance with the present invention, a method is provided for virtually embedding or de-embedding one or more balanced four-port networks from/into a four-port device under test (DUT). This method includes the steps of acquiring a set of scattering-parameters for the DUT and then generating a transfer-matrix for the DUT based on the set of scattering-parameters for the DUT. A set of scattering-parameters for each of the one or more balanced four-port networks to be embedded or de-embedded is also acquired. A corresponding transfer-matrix is then generated for each of the one or more balanced four-port networks that is to be embedded/de-embedded into/from the DUT, each transfer-matrix being generated based on the corresponding set of acquired scattering-parameters. The transfer-matrix for the DUT is then multiplied with the transfer-matrix associated with each balanced network to be embedded or with the inverse the transfer-matrix associated with each network to be de-embedded, to thereby produce a composite transfer-matrix. Finally, a set of composite scattering-parameters is then generated based on the composite transfer-matrix. The set of composite scattering-parameters is representative of the DUT with the one or more balanced four-port networks embedded/de-embedded into/from it.

Another embodiment of the present invention is directed to a method of both embedding one or more balanced four-port networks into a four-port DUT and de-embedding one or more further balanced four-port networks from the four-port DUT.

Further embodiments of the present invention are directed to methods for embedding/de-embedding balanced four-port networks into/from a DUT having more than four-ports. A specific embodiment is directed to a method for virtually embedding one or more balanced four-port networks into a 4k-port device under test (DUT), where k is an integer$\geq 2$. This method includes the steps of acquiring a set of scattering-parameters for the DUT and generating a transfer-matrix for the DUT based on the set of scattering-parameters for the DUT. A a set of scattering-parameters is also acquired for each of the one or more balanced four-port networks to be embedded into the DUT. Next, a corresponding dummy transfer-matrix is generated for each of the one or more balanced four-port networks that is to be embedded into the DUT. Each dummy transfer-matrix is a 4k×4k matrix generated based on the corresponding set of acquired scattering-parameters. This enables the transfer-matrix for the DUT to be multiplied with the one or more dummy transfer-matrices to thereby produce a composite transfer-matrix. Finally, a set of composite scattering-parameters is generated based on the composite transfer-matrix. The set of composite scattering-parameters is representative of the 4k-port network with the one or more balanced four-port networks embedded into it. If one or more balanced four-port networks were to be de-embedded from the 4k-port DUT, then the transfer matrix for the DUT is multiplied with inverses of the dummy transfer-matrix generated for each of the one or more balanced four-port networks to be de-embedded.

Additional features and advantages of the present invention, as well as the operation of various embodiments of the present invention, are described in detail below with reference to the accompanying drawings.

BRIEF DESCRIPTION OF THE DRAWINGS

The present invention will be described with respect to particular embodiments thereof, and references will be made to the drawings in which.

DESCRIPTION OF THE PRESENT INVENTION

In the description that follows, the terms network, circuit, device and structure are used interchangeably.

Figure 1A:
FIG. 1A is a diagram illustrating the concept of de-embedding.
Figure 1B:
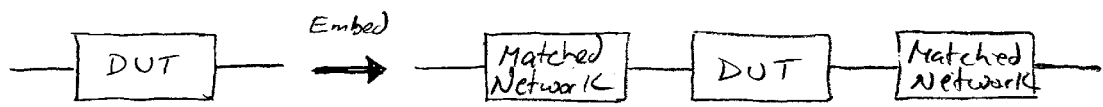
FIG. 1B is a diagram illustrating the concept of embedding.
Figure 2:
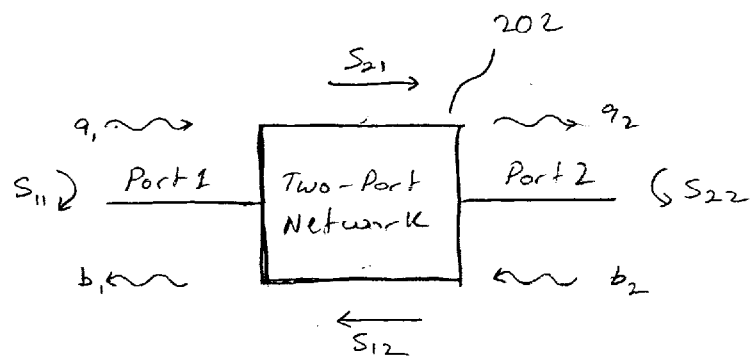
FIG. 2 is a diagram illustrating the incident and reflective waves of a two-port network.
Figure 3:
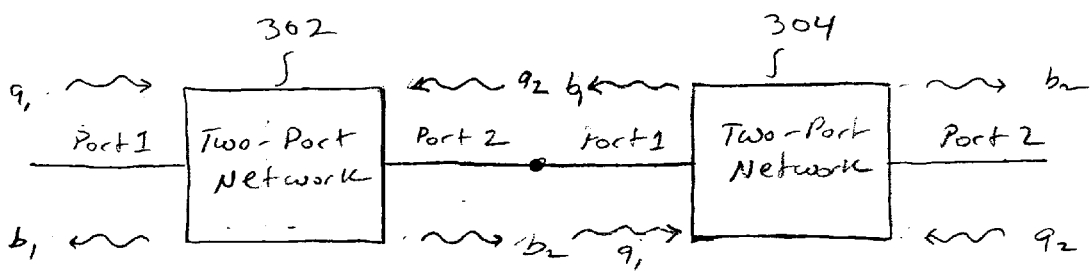
FIG. 3 is a diagram illustrating two cascaded two-port networks.
Figure 4:
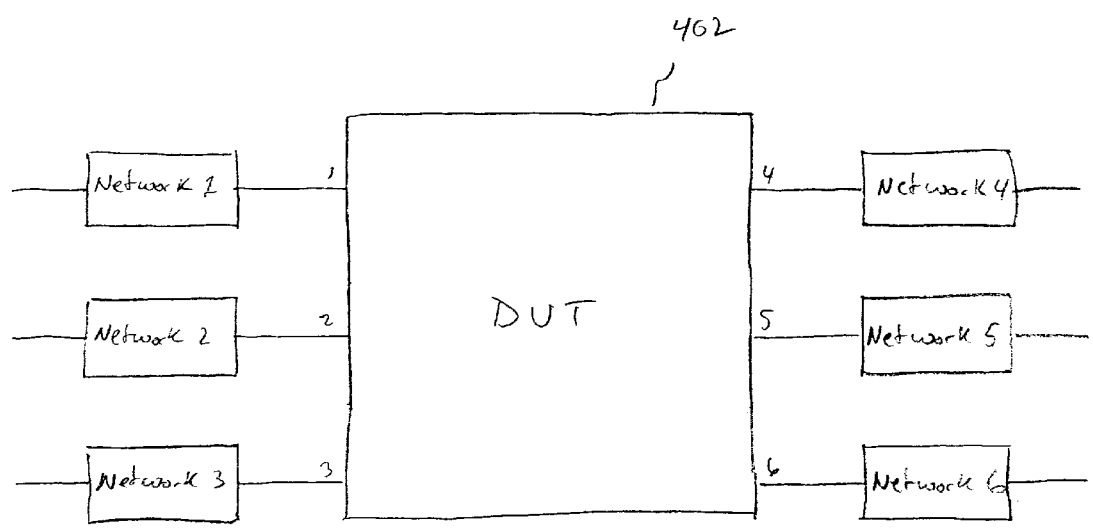
FIG. 4 is a diagram illustrating a six-port device under test (DUT) that is used to describe an extension of a two-port concatination methodology.
Figure 5A:
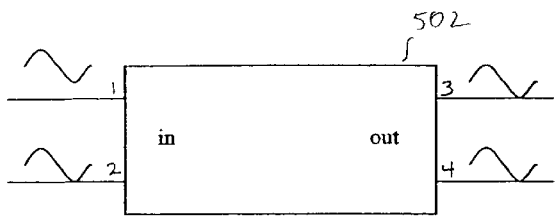
FIGS. 5A–5D are diagrams illustrating the behavior of the class of balanced devices.
Figure 5B:
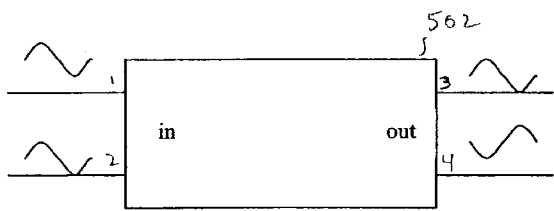
Figure 5C:
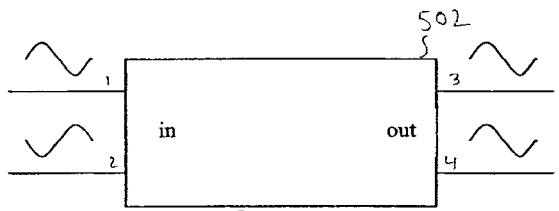
Figure 5D:
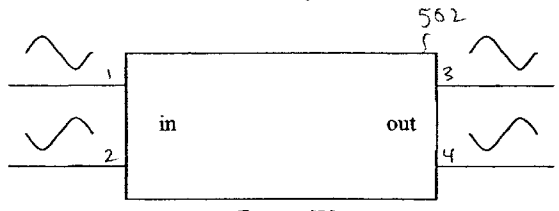
Figure 6:
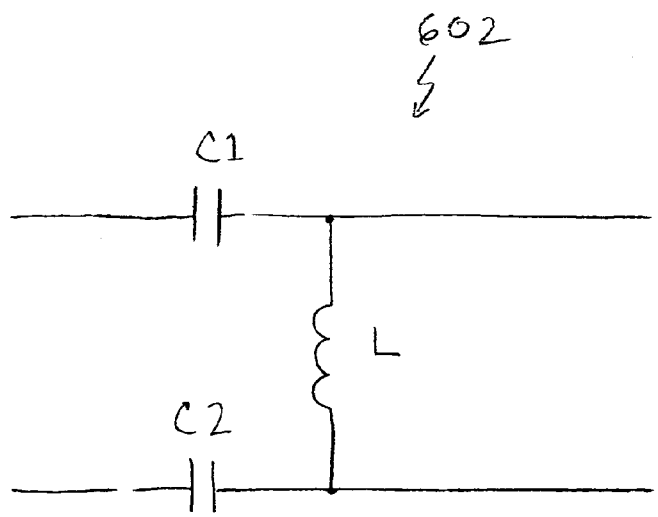
FIG. 6 is a circuit diagram of an exemplary matching network.
Figure 8:
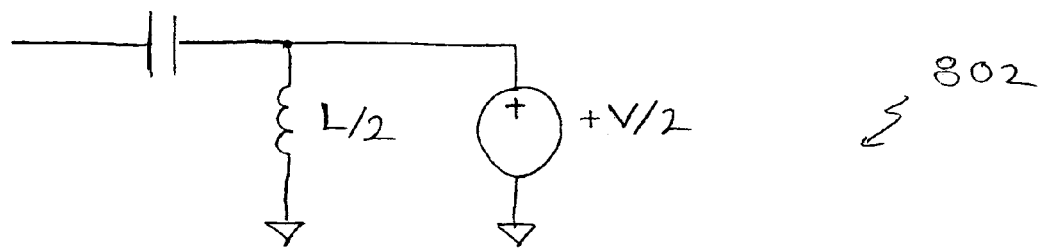
FIG. 8 is a circuit diagram showing the differential equivalent of the matching network in FIG. 6.
Figure 8:
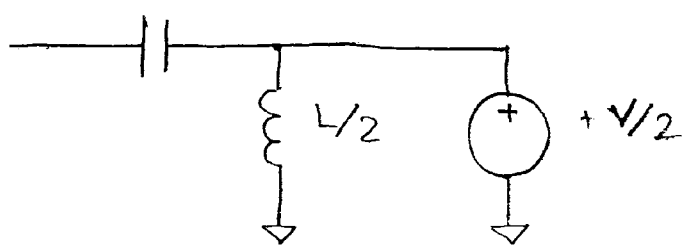
Figure 7:
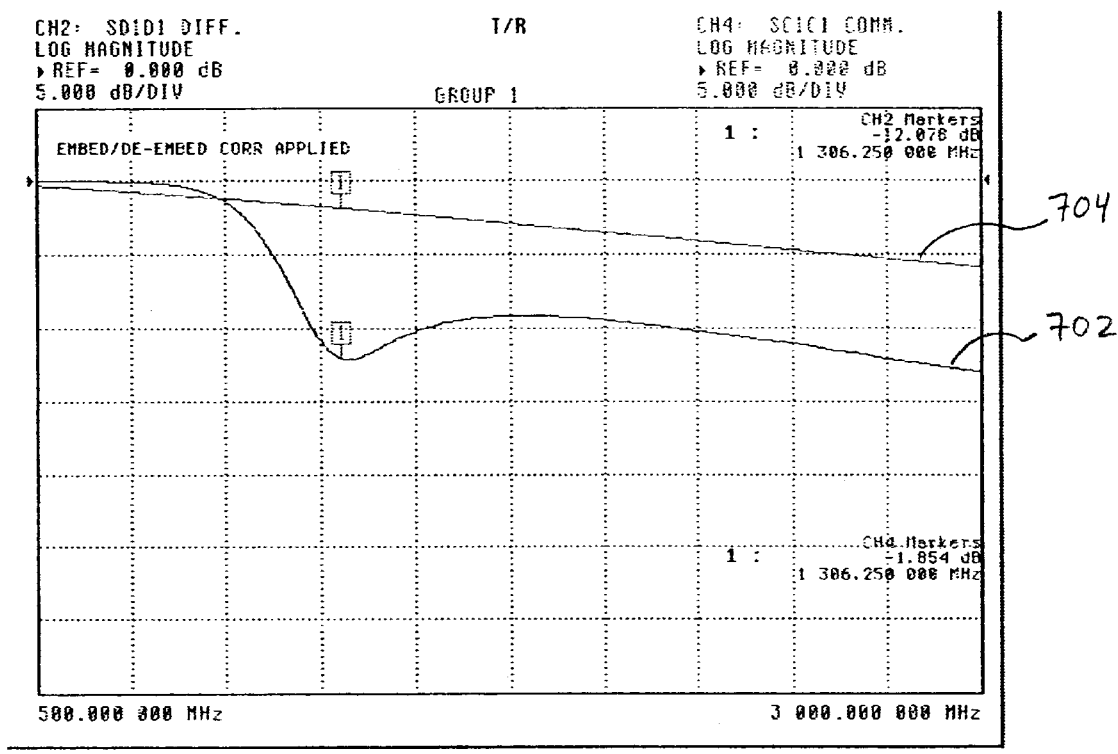
FIG. 7 is a graph showing the different responses for the exemplary matching network illustrated in the circuit diagram of FIG. 6.
Figure 9:
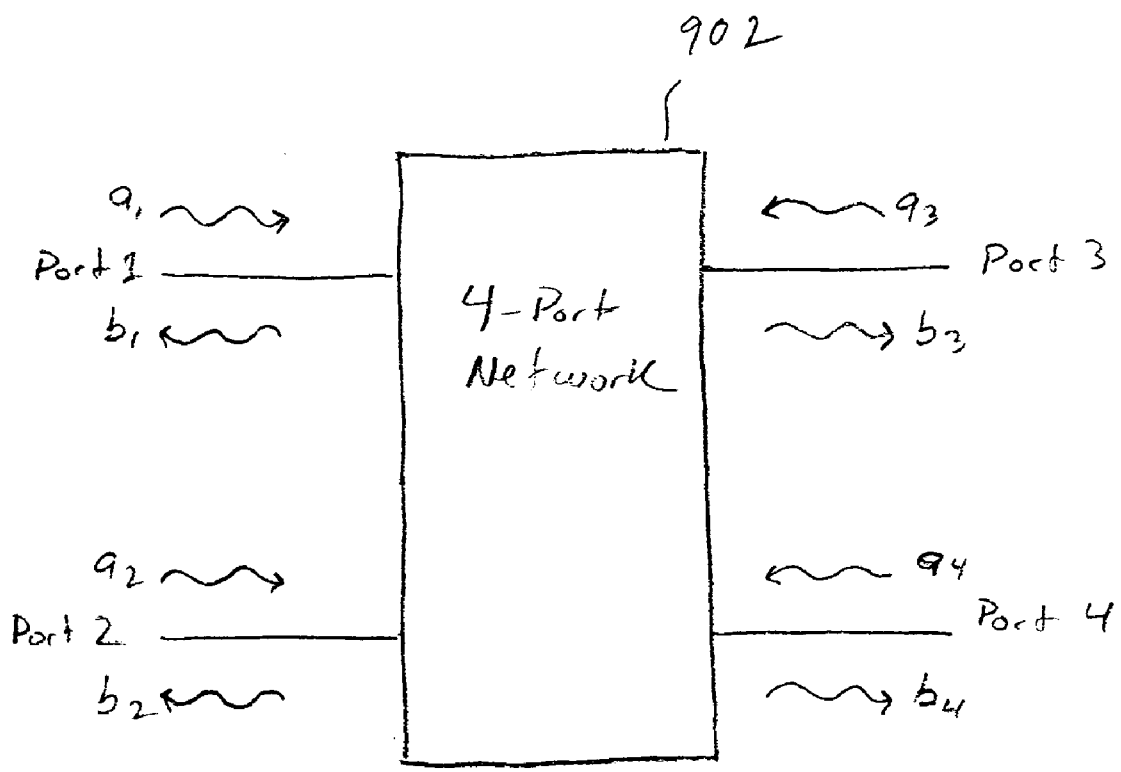
FIG. 9 is a diagram illustrating the incident and reflective waves of a four-port network.
Figure 10:
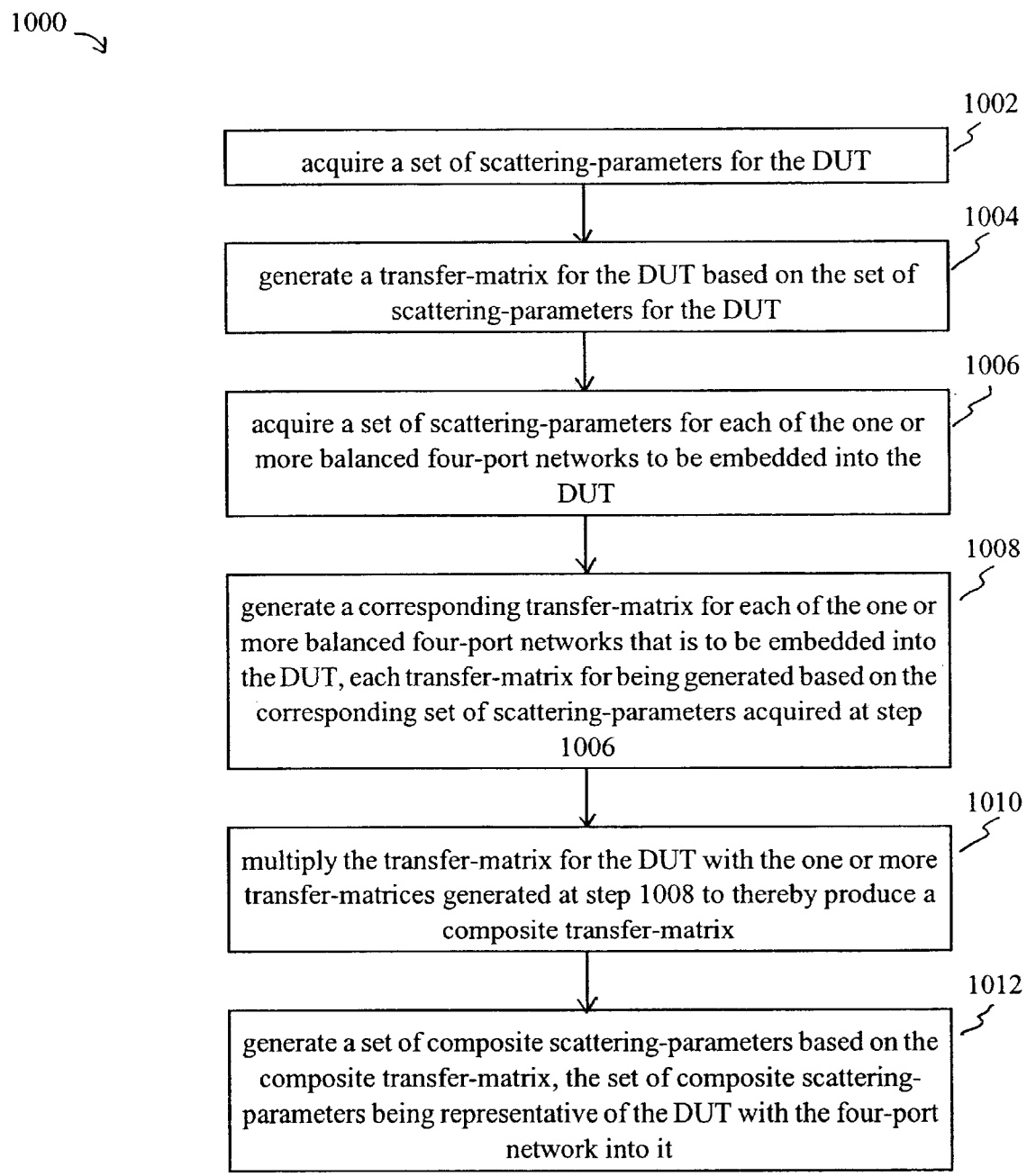
FIG. 10 is a flow chart describing a method for embedding a balanced four-port network into a four-port DUT, according to an embodiment of the present invention.

I. Embedding/De-Embedding One or More Balanced Four-Port Networks Into/From a Four-Port Dut To understand the concept of embedding/de-embedding a balanced four-port network in accordance with the present invention, it is useful to first discuss the simple T-matrix calculation discussed previously, but with all four-port devices. FIG. 9 illustrates a four-port device 902 in which ports 1 and 2 will be treated as a first pair of differential ports (with waves $a_1$, $b_1$, $a_2$ and $b_2$ being referred to as first pair waves), and ports 3 and 4 will be treated as a second pair of differential ports (with waves $a_3$, $b_3$, $a_4$ and $b_4$ being referred to as second pair waves). The S-parameters associated with four-port network 902 of FIG. 9 are defined by Equation 5A, shown below. To enable cascading, the waves associated with ports 3 and 4 (i.e., $a_3$, $b_3$, $a_4$ and $b_4$) are treated as independent variables of a T-matrix equation, and those associated with ports 1 and 2 (i.e., $a_1$, $b_1$, $a_2$, $b_2$) are treated as dependent variables. This leads to the T-matrix shown in Equation 5B below.

$$\begin{bmatrix} b_1 \\ b_2 \\ b_3 \\ b_4 \end{bmatrix} = \begin{bmatrix} S_{11} & S_{12} & S_{13} & S_{14} \\ S_{21} & S_{22} & S_{23} & S_{24} \\ S_{31} & S_{32} & S_{33} & S_{34} \\ S_{41} & S_{42} & S_{43} & S_{44} \end{bmatrix} \begin{bmatrix} a_1 \\ a_2 \\ a_3 \\ a_4 \end{bmatrix} \quad \text{(Equation 5A)}$$

$$\begin{bmatrix} a_1 \\ a_2 \\ b_1 \\ b_2 \end{bmatrix} = \begin{bmatrix} T_{11} & T_{12} & T_{13} & T_{14} \\ T_{21} & T_{22} & T_{23} & T_{24} \\ T_{31} & T_{32} & T_{33} & T_{34} \\ T_{41} & T_{42} & T_{43} & T_{44} \end{bmatrix} \begin{bmatrix} b_3 \\ b_4 \\ a_3 \\ a_4 \end{bmatrix} \quad \text{(Equation 5B)}$$

An investigation of the relationship between the T-parameters and the S-parameters, and where any singularities may exist, is accomplished by evaluating Equation 5B under the conditions used to derive the S-parameters. This is accomplished by setting all $a_i=0$ except for one (the one associated with the driving port). By beginning with all $a_i=0$ except for $a_1$, Equations 6 shown below result.

$$a_1 = T_{11}b_3 + T_{12}b_4$$

$$0 = T_{21}b_3 + T_{22}b_4$$

$$b_1 = T_{31}b_3 + T_{32}b_4$$

$$b_2 = T_{41}b_3 + T_{42}b_4 \quad \text{(Equations 6)}$$

Dividing though each equation by $a_1$ and using the definitions of S-parameters (e.g., $$S_{31} = \frac{b_3}{a_1},$$

when all $a_i=0$ except for $a_1$) results in Equations 7, shown below.

$$1 = T_{11}S_{31} + T_{12}S_{41} \quad \text{(Equations 7)}$$

$$0 = T_{21}S_{31} + T_{22}S_{41}$$

$$1 = T_{31}\frac{S_{31}}{S_{11}} + T_{32}\frac{S_{41}}{S_{11}}$$

$$1 = T_{41}\frac{S_{31}}{S_{21}} + T_{42}\frac{S_{41}}{S_{21}}$$

Repeating this process for all $a_i=0$ except for $a_2$ (including dividing through by $a_2$ this time) results in Equations 8, shown below.

$$0 = T_{11}S_{32} + T_{12}S_{42} \quad \text{(Equations 8)}$$

$$1 = T_{21}S_{32} + T_{22}S_{42}$$

$$1 = T_{31}\frac{S_{32}}{S_{12}} + T_{32}\frac{S_{42}}{S_{12}}$$

$$1 = T_{41}\frac{S_{32}}{S_{22}} + T_{42}\frac{S_{42}}{S_{22}}$$

The above eight equations (i.e., the four equations of Equations 7 and the four of Equations 8) are then combined, starting by using the two equations with 0 left-hand sides (solve for $T_{11}$ and $T_{21}$) and substituting amongst the first two equations in each group (for a total of four equations). This results in Equations 9 shown below.

$$T_{11} = \frac{-S_{42}}{S_{32}S_{41} - S_{42}S_{31}} \quad \text{(Equations 9)}$$

$$T_{12} = \frac{S_{32}}{S_{32}S_{41} - S_{42}S_{31}}$$

$$T_{21} = \frac{S_{41}}{S_{32}S_{41} - S_{42}S_{31}}$$

$$T_{22} = \frac{-S_{31}}{S_{32}S_{41} - S_{42}S_{31}}$$

The above described process if then continued for the remaining four equations of the initial group of eight equations (of Equations 7 and Equations 8). To simplify the expressions, some of the T-parameters are expressed in terms of other T-parameters. Note, however, that circular definitions are avoided. The resulting equations are shown below in Equations 10.

$$T_{32} = \frac{S_{11}S_{32} - S_{12}S_{31}}{S_{32}S_{41} - S_{31}S_{42}} \quad \text{(Equations 10)}$$

$$T_{31} = \frac{S_{11} - T_{32}S_{41}}{S_{31}}$$

$$T_{42} = \frac{S_{32}S_{21} - S_{22}S_{31}}{S_{32}S_{41} - S_{31}S_{42}}$$

$$T_{41} = \frac{S_{21} - T_{42}S_{41}}{S_{31}}$$

Finally, after returning to Equation 5B and evaluating the equation with all $a_i = 0$ except $a_3$ and all $a_i = 0$ except $a_4$ (and dividing through by $a_3$ and $a_4$, respectively), the final eight equations for the T-parameters are generated. These are shown in Equations 11 below:

$$T_{13} = -T_{11}S_{33} - T_{12}S_{43}$$

$$T_{23} = -T_{21}S_{33} - T_{22}S_{43}$$

$$T_{33} = S_{13} - T_{31}S_{33} - T_{32}S_{43}$$

$$T_{43} = S_{23} - T_{41}S_{33} - T_{42}S_{43}$$

$$T_{14} = -T_{11}S_{34} - T_{12}S_{44}$$

$$T_{24} = -T_{21}S_{34} - T_{22}S_{44}$$

$$T_{34} = S_{14} - T_{31}S_{34} - T_{32}S_{44}$$

$$T_{44} = S_{24} - T_{41}S_{34} - T_{42}S_{44} \quad \text{(Equations 11)}$$

Once all the T-parameters have been obtained for the desired networks (i.e., once the T-matrix has been generated for each network), the T-matrices can simply be multiplied when embedding a network, or multiplied by $T^{-1}$ to de-embed a network. Once all of the embedding/de-embedding is complete, the resulting composite T-matrix is converted back to S-parameters. The reverse process (expressing S-parameters in terms of T-parameters) is performed by returning to Equation 5A and using the definitions of T-parameters. First all second pair waves are set=0 except $b_4$, and then all second pair waves are set=0 except $b_3$. By dividing through by $b_4$ and $b_3$, respectively, and solving as before, Equations 12 result, which are shown below.

$$S_{41} = \frac{-T_{21}}{T_{11}T_{22} - T_{12}T_{21}} \quad \text{(Equations 12)}$$

$$S_{42} = \frac{T_{11}}{T_{11}T_{22} - T_{12}T_{21}}$$

$$S_{31} = \frac{T_{22}}{T_{11}T_{22} - T_{12}T_{21}}$$

$$S_{32} = \frac{-T_{12}}{T_{11}T_{22} - T_{12}T_{21}}$$

$$S_{22} = \frac{T_{11}T_{42} - T_{12}T_{41}}{T_{11}T_{22} - T_{12}T_{21}}$$

$$S_{21} = \frac{T_{42} - S_{22}T_{22}}{T_{12}}$$

$$S_{12} = \frac{T_{11}T_{32} - T_{12}T_{31}}{T_{11}T_{22} - T_{12}T_{21}}$$

$$S_{11} = \frac{T_{32} - S_{12}T_{22}}{T_{12}}$$

Like before, next all second pair waves are set=0 except $a_3$, and then all second pair waves are set=0 except $a_4$. By dividing through by $b_3$ and $b_4$, respectively, and solving as before, this results in the eight expressions of Equations 13, shown below.

$$S_{13} = T_{33} - S_{11}T_{13} - S_{12}T_{23}$$

$$S_{23} = T_{43} - S_{21}T_{13} - S_{22}T_{23}$$

$$S_{33} = -S_{31}T_{13} - S_{32}T_{23}$$

$$S_{43} = -S_{41}T_{13} - S_{42}T_{23}$$

$$S_{14} = T_{34} - S_{11}T_{14} - S_{12}T_{24}$$

$$S_{24} = T_{44} - S_{21}T_{14} - S_{22}T_{24}$$

$$S_{34} = -S_{31}T_{14} - S_{32}T_{24}$$

$$S_{44} = -S_{41}T_{14} - S_{42}T_{24} \quad \text{(Equations 13)}$$

The above discussed method is summarized in flow chart of 10, which illustrates a method 1000 for virtually embedding one or more balanced four-port networks with measured data of a four-port device under test (DUT). At a first step 1002, a set of S-parameters for the DUT is acquired. For a four-port DUT, the set of S-parameters includes $S_{11}$, $S_{12}$, $S_{13}$, $S_{14}$, $S_{21}$, $S_{22}$, $S_{23}$, $S_{24}$, $S_{31}$, $S_{32}$, $S_{33}$, $S_{34}$, $S_{41}$, $S_{42}$, $S_{43}$ and $S_{44}$. These S-parameters may be known (e.g., predetermined). Alternatively, these S-parameters can be measured, for example, using a VNA or any alternative known method.

At a next step 1004, a transfer-matrix for the DUT is generated based on the first set of S-parameters. This requires solving for each of the T-parameters of the transfer matrix for the DUT, which can be accomplished by applying Equations 9, 10 and 11, discussed above. More specifically, the transfer-parameters of the transfer-matrix for the DUT are solved using Equations 9, 10 and 11 and the S-parameters acquired at step 1002.

At a next step 1006, a set of S-parameters is acquired for each balanced four-port network that is to be embedded into the measured data of the four-port DUT. The S-parameters for each balanced four-port network may be known (e.g., predetermined). Alternatively, these S-parameters can be measured, for example, using a VNA or any alternative known method. Thus, if only one balanced four-port network is to be embedded or de-embedded, the set of S-parameters for the one balanced four-port network is acquired. If however, multiple balanced four-port networks are to be embedded/de-embedded, then a corresponding set of S-parameters is acquired for each of the balanced four-port networks.

At a step 1008, a corresponding transfer-matrix is generated for each of the one or more balanced four-port network that is to be embedded into the DUT. Each transfer-matrix is generated based on the corresponding set of S-parameters acquired at step 1006. Similar to step 1004, step 1008 is accomplished by applying Equations 9, 10 and 11, discussed above. More specifically, the transfer-parameters for each transfer-matrix can be solved using Equations 9, 10 and 11 and the corresponding S-parameters acquired at step 1006.

At a step 1010, the transfer-matrix for the DUT (generated at step 1004) is multiplied with the one or more transfer-matrices generated at step 1008 to thereby produce a composite transfer-matrix. When performing this step, the order of the matrices during multiplication should be the same as the order in which the devices are to be connected to one another. For example if a first balanced four-port network is to be embedded into the left of the DUT, and a second balanced four-port network is to be embedded into the right of the DUT, then the order of T-matrix multiplication is as follows: the T-matrix for the first balanced four-port network is on the far left; the T-matrix for the DUT is next (i.e., in the middle); and the T-matrix for the second balanced four-port network is at the far right. The result of multiplying the three T-matrices is the composite T-matrix.

Finally, at a step 1012, a set of composite S-parameters is generated based on the composite transfer-matrix determined at step 1010. More specifically, composite S-parameters can be solved using Equations 12 and 13 discussed above. The set of composite S-parameters is representative of the DUT with the one or more balanced four-port networks embedded into it.

It would be apparent to one of ordinary skill in the relevant art that some of the steps of method 1000 need not be performed in the exact order just described. For example, step 1006 can be performed prior to step 1004. However, it would also be apparent to one of ordinary skill in the relevant art that some of the steps must be performed before others. For example, step 1002 must be performed prior to step 1004. This is because step 1004 uses the results of step 1002. Similarly, step 1006 must be performed before step 1008 because step 1008 uses the results of step 1006. However, steps 1006 and 1008 can be performed prior to steps 1002 and 1004. The point is, the order of the steps is only important where a step uses results of another step. This applies to the additional flow diagrams discussed below.

Figure 11:
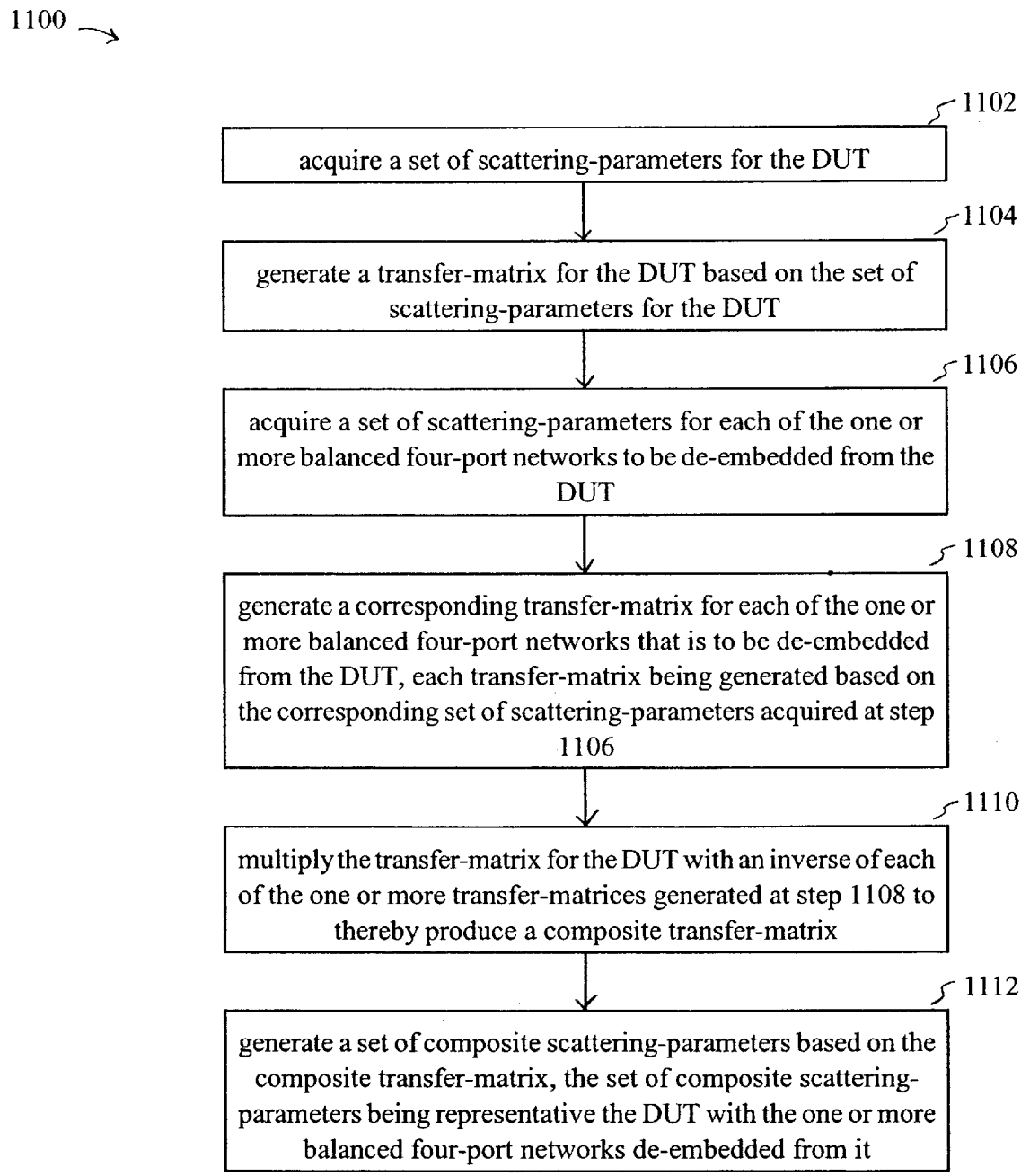
FIG. 11 is a flow chart describing a method for de-embedding a balanced four-port network from a four-port DUT, according to an embodiment of the present invention.

Referring to FIG. 11, a method 1100 for de-embedding one or more balanced four-port networks from measured data of a four-port DUT is very similar to the method 1000 explained above. Comparing method 1100 to method 1000, the only significant difference is at step 1110, where the transfer-matrix for the DUT is multiplied with the inverse of each transfer-matrix for the balanced four-port networks. Calculating an inverse of a matrix is well known, and thus, is not described herein.

The utility of many of the above equations is dependent on singularities associated with the equations. For example, looking back at the two-port T-parameters expression (Equation 3), there is a singularity at $S_{21}=0$. A singularity is defined herein as a point at which an equation explodes to infinity. A singularity at $S_{21}=0$ is not much of an impediment to usefulness since cascading matrices without transmission is not particularly practical. In the equation of the present invention, there is a singularity in Equations 9 when $S_{23}S_{41}=S_{42}S_{31}$. If one of the ports has no transmission to any of the other ports, then the singularity will occur since both sides will equal 0. This may lead to some complications when trying to apply the steps in accordance with the present invention to devices not composed of pairs-of-ports. There may even be cases with highly symmetric devices where this may occur as well. While this maybe an issue for devices such as splitters, it does not describe the behavior of most practical balanced devices. Accordingly, it appears that most common devices will not experience singularities and thus the above described embodiments of the present invention will be useful. (Note that $S_{31}=0$ is not a real problem in Equations 10 since those equations reduce in that case to a defined quantity in the limit.)

II. Embedding/De-Embedding Balanced Four-Port Networks Into/From Devices Having More Than Four Ports Provided above is a description of how to embed/de-embed balanced four-port networks into/from measured data of a four-port DUT. While this is extremely useful, there is often the situation where the DUT is not a four-port device. Accordingly, an embodiment of the present invention that enables embedding/de-embedding into/from a DUT with more than four-ports shall now be discussed.

Figure 12:
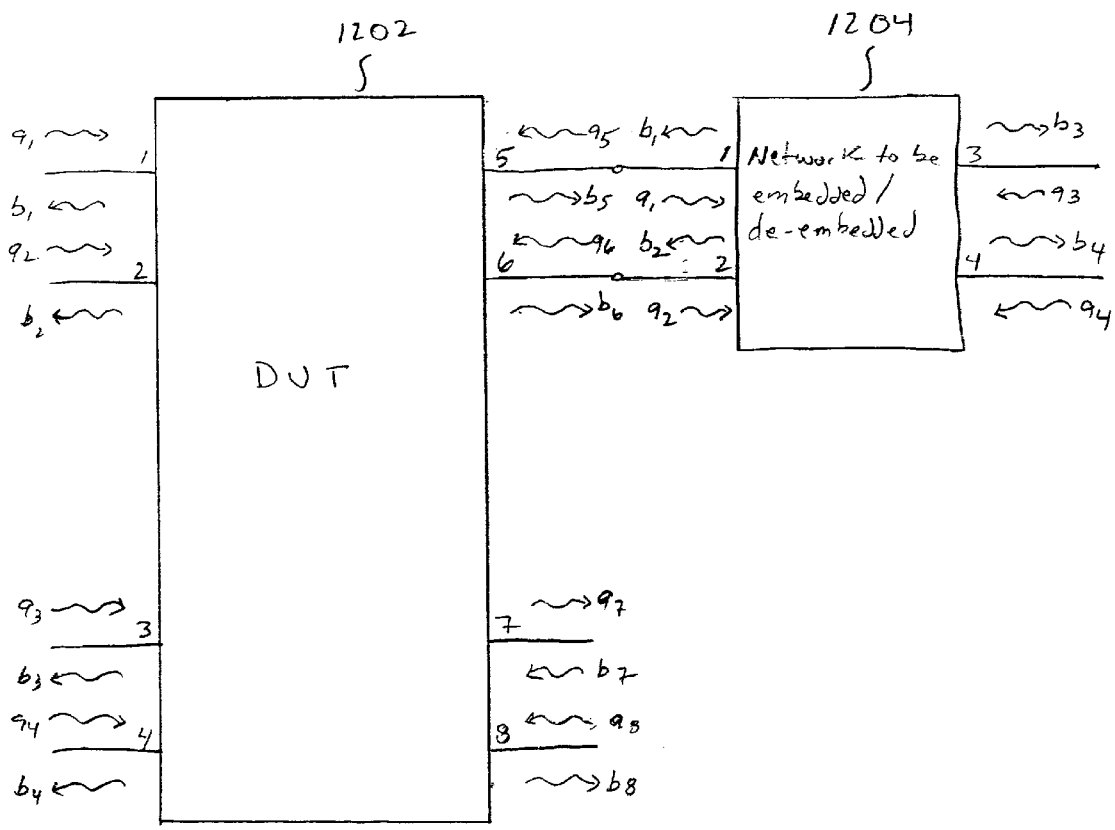
FIG. 12 is a diagram that is useful for describing the embedding of a balanced four-port network into an eight-port device under test, according to an embodiment of the present invention.

Provided first is a discussion of a case where the number of DUT ports is of the form 4k (k=2, 3, 4 . . . ). The situation where k=2 (i.e., where the DUT is an 8-port DUT) is shown in FIG. 12. A method for embedding/de-embedding a four-port balanced network in an eight-port DUT 1202 is similar to methods 1000 and 1100 discussed above.

At a first step, a set of S-parameters for eight-port DUT 1202 is acquired. For an eight-port DUT, 64 S-parameters exist ($S_{11} \ldots S_{88}$). At a next step, a transfer-matrix for DUT 1202 is generated based on the set of S-parameters. The equations for converting the S-parameters to transfer-parameters and vice-versa will not be explicitly shown since it follows the same solution pattern discussed above for a four-port DUT analysis. However the methodology for the conversion will be discussed. Let ports 1 to 2k (e.g., ports 1, 2, 3 and 4, where k=2) be on the 'left' side of the DUT and ports 2k+1 to 4k (e.g., ports 5, 6, 7 and 8, where k=2) be on the 'right side' of the DUT. This assignment is just to define the linkage between devices (i.e., between the DUT and the one or more devices to be embedded/de-embedded). The right side of one device is connected to a left side of the next device. A transfer-matrix for such a 4k-port device is shown below in Equation 14.

$$\begin{bmatrix} a_1 \\ a_2 \\ b_1 \\ b_2 \\ \vdots \\ a_{2k-1} \\ a_{2k} \\ b_{2k-1} \\ b_{2k} \end{bmatrix} = \begin{bmatrix} T_{11} & T_{12} & T_{13} & T_{14} & \cdots & T_{1(4k-3)} & T_{1(4k-2)} & T_{1(4k-1)} & T_{1(4k)} \\ T_{21} & & & & & & & & T_{2(4k)} \\ & & & & & & & & \\ & & & & & & & & \\ \vdots & & & \ddots & & & & & \vdots \\ & & & & & & & & \\ & & & & & & & & \\ & & & & & & & & \\ T_{(4k)1} & & & \cdots & & & & & T_{(4k)(4k)} \end{bmatrix} \begin{bmatrix} b_{2k+1} \\ b_{2k+2} \\ a_{2k+1} \\ a_{2k+2} \\ \vdots \\ b_{4k-1} \\ b_{4k} \\ a_{4k-1} \\ a_{4k} \end{bmatrix} \quad \text{(Equation 14)}$$

The equations that express T-parameters in terms of S-parameters are derived much like they were in the example above where only sixteen S-parameters were being derived (for a four-port device). Note that the matrix parameters are arranged in pairs. While this is somewhat arbitrary, it greatly simplifies the embedding/de-embedding of four-port networks, which is the objective. The equations to express the T-parameters in terms of S-parameters are generated by considering Equation 14 a total of 4k times. Each time, exactly one of the $a_i$ will be non-zero (since this is the basis of the S-parameter definitions). Each time Equation 14 is considered (with only one of the $a_i$ being non-zero), all derived equations are divided though by the non-zero $a_i$, which will leave equations entirely in terms of S and T parameters (recall $S_{ji}=b_j/a_i$ with all $a_m=0$ for m not equal to i). This will result in a total of 16 $k^2$ equations with $16k^2$ unknowns. Accordingly, all of the T-parameters can be solved for in terms of S-parameters (in a similar fashion that Equations 9, 10 and 11 were derived above). Since the S-parameters have been acquired, each T-parameter is now know, and thus the T-matrix is generated.

The next steps are to acquire a set of S-parameters for each of the balanced networks to be embedded/de-embedded and generate a corresponding T-matrix for each network. The T-matrix for each balanced network should be the same size as the T-matrix for the DUT so that multiplication of T-matrices is straight forward. In an embodiment of the present invention where the balanced network being embedded/de-embedded has less ports than the DUT to which it is being embedded/de-embedded, a dummy T-matrix is created. This is discussed in more detail below.

As with four-port DUTs, embedding is performed by multiplying T-matrices together and de-embedding is performed by multiplying by the inverse of the T-matrix for each network to be de-embedded. This is results in a composite T-matrix. Once the composite T-matrix is formed, the next step is to transform the T-matrix back into S-parameters. The S-parameters characterize the DUT with the balanced network(s) embedded/de-embedded. More specifically, start with the S-matrix equation shown below in Equation 15.

$$\begin{bmatrix} b_1 \\ b_2 \\ b_3 \\ b_4 \\ \vdots \\ b_{4k-3} \\ b_{4k-2} \\ b_{4k-1} \\ b_{4k} \end{bmatrix} = \begin{bmatrix} S_{11} & S_{12} & S_{13} & S_{14} & \cdots & S_{1(4k-3)} & S_{1(4k-2)} & S_{1(4k-1)} & S_{1(4k)} \\ S_{21} & & & & & & & & S_{2(4k)} \\ & & & & & & & & \\ & & & & & & & & \\ \vdots & & & \ddots & & & & & \vdots \\ & & & & & & & & \\ & & & & & & & & \\ & & & & & & & & \\ S_{(4k)1} & & & \cdots & & & & & S_{(4k)(4k)} \end{bmatrix} \begin{bmatrix} a_1 \\ a_2 \\ a_3 \\ a_4 \\ \vdots \\ b_{4k-3} \\ b_{4k-2} \\ a_{4k-1} \\ a_{4k} \end{bmatrix} \quad \text{(Equation 15)}$$

To solve for the S-parameters, consider the far right vector in Equation 14. These 4k quantities are the independent variable of the T-matrix equation. Equation 15 is processed a total of 4k times, with each time exactly one independent variable (of Equation 14) being non-zero. Much like the example discussed above, all 4k equations are then divided through by the non-zero variable. Equation 15 is then reduced to a total of $16k^2$ equations with $16k^2$ unknowns. Accordingly, all the S-parameters can be solved for in terms of the T-parameters of the composite T-matrix. Since the T-parameters of the composite T-matrix have been determined, each composite S-parameter is now know. These composite S-parameters characterize the DUT with balanced-network(s) embedded/de-embedded.

As mentioned above, a dummy T-matrix is created for a balanced four-port network when the balanced four-port network is being embedded/de-embedded into/from a DUT that has more than four ports. As also mentioned above, this is done so that multiplication of T-matrices is straight forward. The generation of a dummy T-matrix, according to an embodiment of the present invention, shall now be discussed in more detail. Referring to FIG. 12, a dummy T-matrix for a four-port balanced network 1204 (that is being embedded/de-embedded) should represent pass-throughs for all ports on a side of a DUT 1202 (the right side of DUT 1202, in this example) that are not connected to the four-port balanced network 1204. In this example, the ports on the right side of DUT 1202 that are not connected to balanced four-port network 1204 are ports 7 and 8. Also, there should be no communication between the actual ports of network 1204 and dummy ports represented within the dummy matrix. Thus, the dummy T-matrix for four-port balanced network 1204 will consist of the following four sub-matrices:

1) a first 4×4 sub-matrix representing network 1204;
2 & 3) two 4×(4k−4) sub-matrices of 0s representing the no crosstalk between the four actual ports of balanced four-port network 1204 and all other ports of the dummy-matrix (for the example of FIG. 12, where k=2, there are two 4×4 sub-matrices of 0s); and 4) a (4k−4)×(4k−4) identity sub-matrix representing the pass throughs for all other ports of the dummy T-matrix (for the example of FIG. 12, where k=2, there is a 4×4 identity sub-matrix).

This resulting dummy T-matrix is illustrated below in Equation 16, for the case were network 1204 is connected to ports 5 and 6 of eight-port DUT 1202.

$$\begin{bmatrix} a_1 \\ a_2 \\ b_1 \\ b_2 \\ a_3 \\ a_4 \\ b_3 \\ b_4 \end{bmatrix} = \begin{bmatrix} T_{11} & T_{12} & T_{13} & T_{14} & 0 & 0 & 0 & 0 \\ T_{21} & T_{22} & T_{23} & T_{24} & 0 & 0 & 0 & 0 \\ T_{31} & T_{32} & T_{33} & T_{34} & 0 & 0 & 0 & 0 \\ T_{41} & T_{42} & T_{43} & T_{44} & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \\ 0 & 0 & 0 & 0 & 0 & 0 & 0 & 1 \end{bmatrix} \begin{bmatrix} b_5 \\ b_6 \\ a_5 \\ a_6 \\ b_7 \\ b_8 \\ a_7 \\ a_8 \end{bmatrix} \quad \text{(Equation 16)}$$

As discussed above, once a dummy T-matrix has been generated for each balanced four-port network to be embedded/de-embedded, a composite T-matrix is produced. As also discussed above, to embed network 1204 into DUT 1202, the dummy T-matrix for network 1204 is multiplied with the T-matrix for DUT 1202, to thereby produce the composite T-matrix. To de-embed network 1204 from DUT 1204, the inverse of the dummy T-matrix for network 1204 is multiplied by the T-matrix for DUT 1202. Since the balanced four-port network is embedded/de-embedded into/from the right side of DUT 1202, in the Example of FIG. 12, the dummy T-matrix should be on the right side during multiplication of the T-matrices. After the composite T-matrix is generated, a set of composite S-parameters is generated based on the composite T-matrix. This has been described above. The set of composite S-parameters represents DUT 1202 with four-port balanced network 1204 embedded/de-embedded into/from it.

Figure 13:
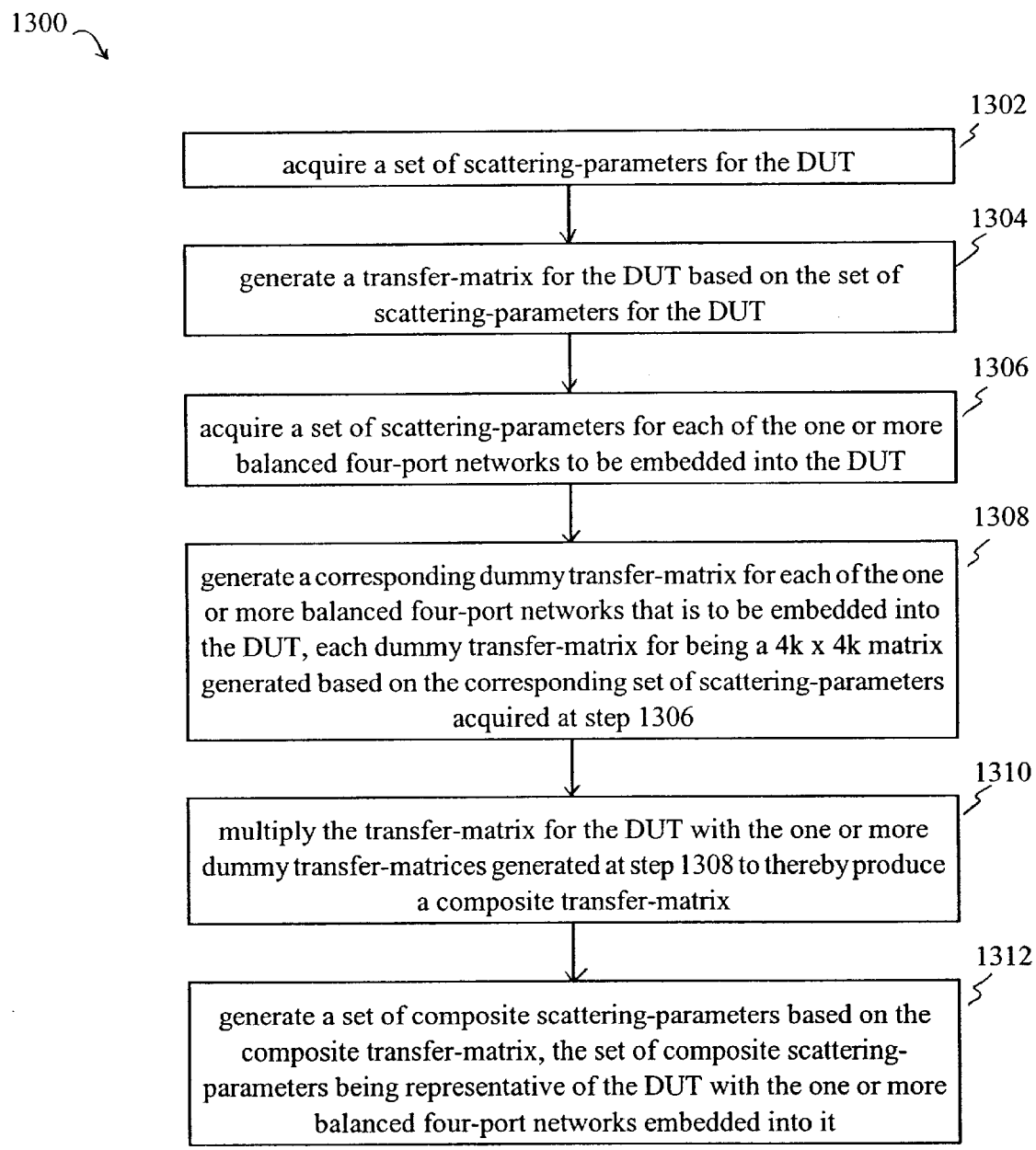
FIG. 13 is a flow chart describing a method for embedding a balanced four-port network into a 2k-port DUT, according to an embodiment of the present invention, where k is an integer greater than or equal to 2.

The above discussed method for virtually embedding one or more balanced four-port networks into a 4k-port DUT, where k is an integer≧2, is summarized in flow chart of FIG. 13. At a first step 1302, a set of S-parameters for the 4k-port DUT is acquired. For a 4k-port DUT, the set of S-parameters includes $(4k)^2$ S-parameters. These S-parameters may be known (e.g., predetermined). Alternatively, these S-parameters can be measured, for example, using a VNA or any alternative known method.

At a next step 1304, a transfer-matrix for the 4k-port DUT is generated based on the set of scattering-parameters for the DUT, as discussed above.

Next, at a step 1306, a set of scattering-parameters is acquired for each of the one or more balanced four-port networks to be embedded into the 4k-port DUT. This is described in detail above.

At a step 1308, a corresponding dummy transfer-matrix is generated for each of the one or more balanced four-port networks that is to be embedded into the 4k-port DUT. Each dummy transfer-matrix is a 4k×4k matrix generated based on the corresponding set of scattering-parameters acquired at step 1306. This is accomplished by performing the following steps for each four-port balanced network be embedded: generating a 4×4 sub-transfer-matrix representative of the balanced four-port network; generating two 4×(4k−4) sub-matrices of 0s representing no crosstalk between actual ports of the balanced four-port network and other ports represented within the dummy-matrix; generating a (4k−4)×(4k−4) identity sub-matrix representing the pass throughs for the other ports represented within the dummy matrix. A 4k×4k matrix is then generated based on the four sub-matrices generated. This 4k×4k matrix is a dummy transfer-matrix that corresponds to the balanced four-port network.

Next, at a step 1310, the transfer-matrix for the 4k-port DUT is multiplied with the one or more dummy transfer-matrices generated at step 1308 to thereby produce a composite transfer-matrix.

Finally, at a step 1312, a set of composite scattering-parameters is generated based on the composite transfer-matrix, the set of composite scattering-parameters being representative of the DUT with the one or more balanced four-port networks embedded into it.

Each of the above steps have been described above in additional detail in connection with FIG. 12. A method for de-embedding one or more balanced circuits from a 4k-port network, where k is an integer≧2, would be similar to method 1300. The main difference is that at step 1110, the 4k-port DUT would be multiplied with the inverse of the dummy T-matrix for each balanced four-port network to be de-embedded.

III. Combining Balanced Embedding and De-Embedding

Described above are methods for embedding balanced four-port networks and methods for de-embedding balanced four-port networks. There may be situations where it is desireable to both embed a balanced four-port network and de-embed a balanced four-port network. This is accomplished by determining a T-matrix for the DUT and determining a T-matrix for each of the networks to be embedded and de-embedded. Then the DUT is then multiplied with the T-matrix of each network to be embedded, and with the inverse of the T-matrix for each network to be de-embedded. Where the DUT is a 4k-port DUT (where k is an integer≧2) as discussed above, a dummy T-matrix should be generated for each of the balanced four-port networks to be embedded and de-embedded. This has been described in detail above.

Figure 14:
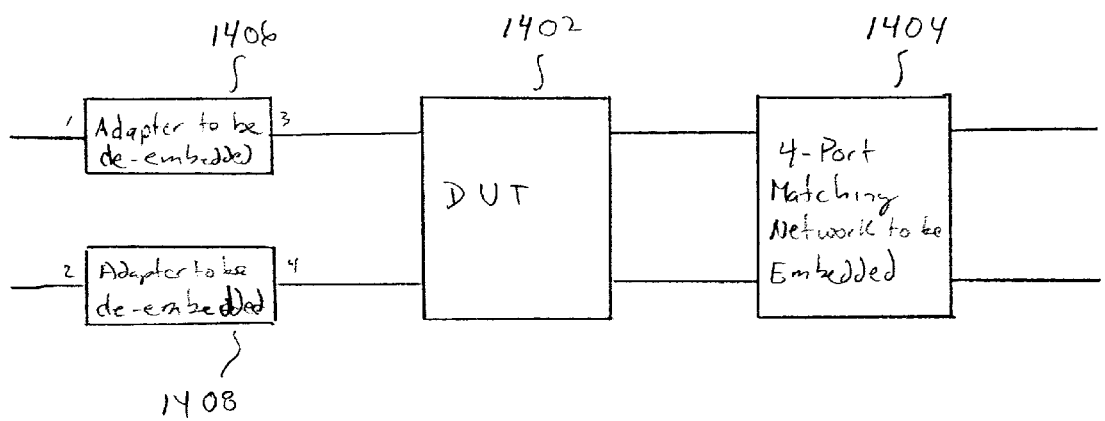
FIG. 14 is a diagram that is useful for describing how two-port conventional embedding/de-embedding techniques can be combined with balanced embedding/de-embedding of the present invention.

IV. Combining Two-Port Conventional Embedding/De-Embedding with Balanced Embedding/De-Embedding There may be situations where it is desirable to combine the balanced embedding/de-embedding of the present invention with conventional two-port embedding/de-embedding. This may occur, for example, when needing to both embed a four-port balanced matching network 1404 into a DUT 1402 and de-embed two two-port adapters 1406 and 1408 or a four-port test fixture), such as shown in FIG. 14.

This can be accomplished by converting the pair of two-port adapters 1406 and 1408 (for a given port pair of DUT 1402) into an equivalent four-port balanced structure, and applying the methodology of the present invention discussed above. When doing this (i.e., converting the pair of two-port adapters into an equivalent balanced four-port network) it is convenient to label the ports on the left of the adapters 1 and 2 and the ports on the right of the adapters 3 and 4, as shown in FIG. 14. In this case, since there is no communication between certain ports (e.g., no communication between port 1 and either of port 3 and 4), as is clear from FIG. 14, and thus, $S_{12}=S_{21}=S_{14}=S_{34}=S_{43}=S_{32}=S_{23}=0$. In this case, the expressions for the T-parameters reduce to the following:

$T_{12} = T_{21} = T_{32} = T_{23} = T_{41} = T_{43} = T_{14} = T_{34} = 0$ (Equations 17)

$T_{11} = 1/S_{31}$ $T_{22} = 1/S_{42}$ $T_{31} = S_{11}/S_{31}$ $T_{42} = S_{22}/S_{42}$ $T_{13} = S_{33}/S_{31}$ $T_{33} = S_{13} - \dfrac{S_{11}S_{33}}{S_{31}}$ $T_{24} = S_{44}/S_{42}$ $T_{33} = S_{24} - \dfrac{S_{22}S_{44}}{S_{42}}$ Once the T-parameters for the pair of two-port adapters are derived, the above described methodology of the present invention is applied. For the example of FIG. 14, an inverse of the T-matrix generated for the pair of two-port adapters (1406 and 1408) is multiplied with a T-matrix for DUT 1402, which is multiplied with a T-matrix for the four-port balanced matching network 1404. A composite T-matrix results, from which composite S-parameters are determined. The composite S-parameters characterize DUT 1402 with adapters 1406 and 1408 de-embedded, and balanced four-port network 1404 embedded.

CONCLUSION

The foregoing description of the preferred embodiments has been provided to enable any person skilled in the art to make or use the present invention. While the invention has been particularly shown and described with reference to preferred embodiments thereof, it will be understood by those skilled in the art that various changes in form and details may be made therein without departing from the spirit and scope of the invention.

The present invention has been described above with the aid of flow diagrams illustrating the performance of specified steps and relationships thereof. The boundaries of the blocks within the flow diagrams have often been arbitrarily defined herein for the convenience of the description. Alternate boundaries can be defined so long as the specified steps and relationships thereof are appropriately performed. Any such alternate boundaries are thus within the scope and spirit of the claimed invention. Thus, the breadth and scope of the present invention should not be limited by any of the above-described exemplary embodiments, but should be defined only in accordance with the following claims and their equivalents.

What is claimed is:

1. A method for virtually embedding one or more balanced four-port networks into a four-port device under test (DUT), the method comprising the steps of:
   (a) acquiring a set of scattering-parameters for the DUT;
   (b) generating a transfer-matrix for the DUT based on the set of scattering-parameters for the DUT;
   (c) acquiring a set of scattering-parameters for each of the one or more balanced four-port networks to be embedded into the DUT;
   (d) generating a corresponding transfer-matrix for each of the one or more balanced four-port networks that is to be embedded into the DUT, each transfer-matrix being generated based on the corresponding set of scattering-parameters acquired at step (c);
   (e) multiplying the transfer-matrix for the DUT with the one or more transfer-matrices generated at step (d) to thereby produce a composite transfer-matrix; and
   (f) generating a set of composite scattering-parameters based on the composite transfer-matrix, the set of composite scattering-parameters being representative of the DUT with the one or more balanced four-port networks embedded into it.

2. The method of claim 1, wherein the set of scattering-parameters for the DUT includes scattering parameters $S_{11}$, $S_{12}$, $S_{13}$, $S_{14}$, $S_{21}$, $S_{22}$, $S_{23}$, $S_{24}$, $S_{31}$, $S_{32}$, $S_{33}$, $S_{34}$, $S_{41}$, $S_{42}$, $S_{43}$ and $S_{44}$.

3. The method of claim 2, wherein step (b) comprises:
   (b.1) expressing each transfer-parameter of the transfer-matrix for the DUT in terms of the S-parameters for the DUT; and
   (b.2) solving for each transfer-parameter of the transfer-matrix for the DUT.

4. The method of claim 3, wherein step (b) includes generating transfer-parameters $T_{11}$, $T_{12}$, $T_{21}$ and $T_{22}$ of the transfer-matrix for the DUT in accordance with the following equations:

$T_{11} = \dfrac{-S_{42}}{S_{32}S_{41} - S_{42}S_{31}}$ $T_{12} = \dfrac{S_{32}}{S_{32}S_{41} - S_{42}S_{31}}$ $T_{21} = \dfrac{S_{41}}{S_{32}S_{41} - S_{42}S_{31}}$ $T_{22} = \dfrac{-S_{31}}{S_{32}S_{41} - S_{42}S_{31}}.$ 5. The method of claim 4, wherein step (b) further includes generating transfer-parameters $T_{32}$, $T_{31}$, $T_{42}$ and $T_{41}$ of the transfer-matrix for the DUT in accordance with the following equations:

$T_{32} = \dfrac{S_{11}S_{32} - S_{12}S_{31}}{S_{32}S_{41} - S_{31}S_{42}}$ $T_{31} = \dfrac{S_{11} - T_{32}S_{41}}{S_{31}}$ $T_{42} = \dfrac{S_{32}S_{21} - S_{22}S_{31}}{S_{32}S_{41} - S_{31}S_{42}}$ $T_{41} = \dfrac{S_{21} - T_{42}S_{41}}{S_{31}}.$ 6. The method of claim 5, wherein step (b) further includes generating transfer parameters $T_{13}$, $T_{23}$, $T_{33}$, $T_{43}$, $T_{14}$, $T_{24}$, $T_{34}$ and $T_{44}$ of the transfer-matrix for the DUT in accordance with the following equations:

$T_{13} = -T_{11}S_{33} - T_{12}S_{43}$ $T_{23} = -T_{21}S_{33} - T_{22}S_{43}$ $T_{33} = S_{13} - T_{31}S_{33} - T_{32}S_{43}$ $T_{43} = S_{23} - T_{41}S_{33} - T_{42}S_{43}$ $T_{14} = -T_{11}S_{34} - T_{12}S_{44}$ $T_{24} = -T_{21}S_{34} - T_{22}S_{44}$ $T_{34} = S_{14} - T_{31}S_{34} - T_{32}S_{44}$ $T_{44} = S_{24} - T_{41}S_{34} - T_{42}S_{44}.$

7. The method of claim 6, wherein set of scattering-parameters for each of the one or more balanced four-port networks to be embedded into the DUT includes scattering parameters $S^n_{11}$, $S^n_{12}$, $S^n_{13}$, $S^n_{14}$, $S^n_{21}$, $S^n_{22}$, $S^n_{23}$, $S^n_{24}$, $S^n_{31}$, $S^n_{32}$, $S^n_{33}$, $S^n_{34}$, $S^n_{41}$, $S^n_{42}$, $S^n_{43}$ and $S^n_{44}$, wherein n specifies a specific one of the one or more balanced four-port networks.

8. The method of claim 7, wherein step (d) comprises generating each corresponding transfer-matrix in accordance with the following equations:

$$T^n_{11} = \frac{-S^n_{42}}{S^n_{32}S^n_{41} - S^n_{42}S^n_{31}} \qquad T^n_{32} = \frac{S^n_{11}S^n_{32} - S^n_{12}S^n_{31}}{S^n_{32}S^n_{41} - S^n_{31}S^n_{42}} \qquad T^n_{13} = -T^n_{11}S^n_{33} - T^n_{12}S^n_{43}$$

$$T^n_{23} = -T^n_{21}S^n_{33} - T^n_{22}S^n_{43}$$

$$T^n_{12} = \frac{S_{32}}{S^n_{32}S^n_{41} - S^n_{42}S^n_{31}} \qquad T^n_{31} = \frac{S^n_{11} - T^n_{32}S^n_{41}}{S^n_{31}} \qquad T^n_{33} = S^n_{13} - T^n_{31}S^n_{33} - T^n_{32}S^n_{43}$$

$$T^n_{43} = S^n_{23} - T^n_{41}S^n_{33} - T^n_{42}S^n_{43}$$

$$T^n_{21} = \frac{S'_{41}}{S^n_{32}S^n_{41} - S^n_{42}S^n_{31}} \qquad T^n_{42} = \frac{S^n_{32}S^n_{21} - S^n_{22}S^n_{31}}{S^n_{32}S^n_{41} - S^n_{31}S^n_{42}} \qquad T^n_{14} = -T^n_{11}S^n_{34} - T^n_{12}S^n_{44}$$

$$T^n_{24} = -T^n_{21}S^n_{34} - T^n_{22}S^n_{44}$$

$$T^n_{22} = \frac{-S^n_{31}}{S^n_{32}S^n_{41} - S^n_{42}S^n_{31}} \qquad T^n_{41} = \frac{S^n_{21} - T^n_{42}S^n_{41}}{S^n_{31}} \qquad T^n_{34} = S^n_{14} - T^n_{31}S^n_{34} - T^n_{32}S^n_{44}$$

$$T^n_{44} = S^n_{24} - T^n_{41}S^n_{34} - T^n_{42}S^n_{44},$$

where n specifies a specific one of the one or more balanced four-port networks.

9. The method of claim 1, wherein step (e) includes multiplying the transfer-matrix for the DUT with the transfer-matrices for the one or more balanced four-port networks to be embedded, in accordance with a relative order of the one or more networks to be embedded and the DUT, to thereby produce the composite transfer-matrix.

10. The method of claim 1, wherein step (f) comprises
(f.1) expressing each composite scattering-parameter in terms of composite transfer-parameters of the composite transfer-matrix; and
(f.2) solving for each composite scattering-parameter.

11. The method of claim 1, wherein step (f) comprises generating the set of composite scattering-parameters in accordance with the following equations:

$$S'_{41} = \frac{-T'_{21}}{T'_{11}T'_{22} - T'_{12}T'_{21}} \qquad S'_{13} = T'_{33} - S'_{11}T'_{13} - S'_{12}T'_{33}$$

$$S'_{23} = T'_{43} - S'_{21}T'_{13} - S'_{22}T'_{23}$$

$$S'_{42} = \frac{T'_{11}}{T'_{11}T'_{22} - T'_{12}T'_{21}} \qquad S'_{33} = -S'_{31}T'_{13} - S'_{32}T'_{23}$$

$$S'_{31} = \frac{T'_{22}}{T'_{11}T'_{22} - T'_{12}T'_{21}} \qquad S'_{43} = -S'_{41}T'_{13} - S'_{42}T'_{23}$$

$$S'_{14} = T'_{34} - S'_{11}T'_{14} - S'_{12}T'_{24}$$

$$S'_{32} = \frac{-T'_{12}}{T'_{11}T'_{22} - T'_{12}T'_{21}} \qquad S'_{24} = T'_{44} - S'_{21}T'_{14} - S'_{22}T'_{24}$$

$$S'_{34} = -S'_{31}T'_{14} - S'_{32}T'_{24}$$

$$S'_{22} = \frac{T'_{11}T'_{42} - T'_{12}T'_{41}}{T'_{11}T'_{22} - T'_{12}T'_{21}} \qquad S'_{44} = -S'_{41}T'_{14} - S'_{42}T'_{24},$$

$$S'_{21} = \frac{T'_{42} - S'_{22}T'_{22}}{T'_{12}}$$

$$S'_{12} = \frac{T'_{11}T'_{32} - T'_{12}T'_{31}}{T'_{11}T'_{22} - T'_{12}T'_{21}}$$

$$S'_{11} = \frac{T'_{32} - S'_{12}T'_{22}}{T'_{12}}$$

where each $S'_{ji}$ is a composite scattering-parameter of the set of composite-scattering parameters, and each $T'_{ji}$ is a composite transfer-parameter of the composite transfer-matrix.

12. A method for virtually de-embedding one or more balanced four-port networks from a four-port device under test (DUT), the method comprising the steps of:

(a) acquiring a set of scattering-parameters for the DUT;
(b) generating a transfer-matrix for the DUT based on the set of scattering-parameters for the DUT;
(c) acquiring a set of scattering-parameters for each of the one or more balanced four-port networks to be embedded into the DUT;
(d) generating a corresponding transfer-matrix for each of the one or more balanced four-port networks that is to be embedded into the DUT, each transfer-matrix for being generated based on the corresponding set of scattering-parameters acquired at step (c);
(e) multiplying the transfer-matrix for the DUT with inverses of the one or more transfer-matrices generated at step (d) to thereby produce a composite transfer-matrix; and
(f) generating a set of composite scattering-parameters based on the composite transfer-matrix, the set of composite scattering-parameters being representative of the DUT with the one or more balanced four-port networks de-embedded from it.

13. The method of claim 12, wherein the set of scattering-parameters for the DUT includes scattering parameters $S_{11}$, $S_{12}$, $S_{13}$, $S_{14}$, $S_{21}$, $S_{22}$, $S_{23}$, $S_{24}$, $S_{31}$, $S_{32}$, $S_{33}$, $S_{34}$, $S_{41}$, $S_{42}$, $S_{43}$ and $S_{44}$.

14. The method of claim 13, wherein step (b) comprises:
(b.1) expressing each transfer-parameter of the transfer-matrix for the DUT in terms of the S-parameters for the DUT; and
(b.2) solving for each transfer-parameter of the transfer-matrix for the DUT.

15. The method of claim 14, wherein step (b) includes generating transfer-parameters $T_{11}$, $T_{12}$, $T_{21}$ and $T_{22}$ of the transfer-matrix for the DUT in accordance with the following equations:

$$T_{11} = \frac{-S_{42}}{S_{32}S_{41} - S_{42}S_{31}}$$

$$T_{12} = \frac{S_{32}}{S_{32}S_{41} - S_{42}S_{31}}$$

$$T_{21} = \frac{S_{41}}{S_{32}S_{41} - S_{42}S_{31}}$$

$$T_{22} = \frac{-S_{31}}{S_{32}S_{41} - S_{42}S_{31}}.$$

16. The method of claim 15, wherein step (b) further includes generating transfer-parameters $T_{32}$, $T_{31}$, $T_{42}$ and $T_{41}$ of the transfer-matrix for the DUT in accordance with the following equations:

$$T_{32} = \frac{S_{11}S_{32} - S_{12}S_{31}}{S_{32}S_{41} - S_{31}S_{42}}$$

$$T_{31} = \frac{S_{11} - T_{32}S_{41}}{S_{31}}$$

$$T_{42} = \frac{S_{32}S_{21} - S_{22}S_{31}}{S_{32}S_{41} - S_{31}S_{42}}$$

$$T_{41} = \frac{S_{21} - T_{42}S_{41}}{S_{31}}.$$

17. The method of claim 16, wherein step (b) further includes generating transfer parameters $T_{13}$, $T_{23}$, $T_{33}$, $T_{43}$, $T_{14}$, $T_{24}$, $T_{34}$ and $T_{44}$ of the transfer-matrix for the DUT in accordance with the following equations:

$$T_{13} = -T_{11}T_{33} - T_{12}S_{43}$$

$$T_{23} = -T_{21}S_{33} - T_{22}S_{43}$$

$$T_{33} = S_{13} - T_{31}S_{33} - T_{32}S_{43}$$

$$T_{43} = S_{23} - T_{41}S_{33} - T_{42}S_{43}$$

$$T_{14} = -T_{11}S_{34} - T_{12}S_{44}$$

$$T_{24} = -T_{21}S_{34} - T_{22}S_{44}$$

$$T_{34} = S_{14} - T_{31}S_{34} - T_{32}S_{44}$$

$$T_{44} = S_{24} - T_{41}S_{34} - T_{42}S_{44}.$$

18. The method of claim 17, wherein set of scattering-parameters for each of the one or more balanced four-port networks to be embedded into the DUT includes scattering parameters $S^n_{11}$, $S^n_{12}$, $S^n_{13}$, $S^n_{14}$, $S^n_{21}$, $S^n_{22}$, $S^n_{23}$, $S^n_{24}$, $S^n_{31}$, $S^n_{32}$, $S^n_{33}$, $S^n_{34}$, $S^n_{41}$, $S^n_{42}$, $S^n_{43}$ and $S^n_{44}$, wherein n specifies a specific one of the one or more balanced four-port networks.

19. The method of claim 18, wherein step (d) comprises generating each corresponding transfer-matrix in accordance with the following equations:

$$T^n_{11} = \frac{-S^n_{42}}{S^n_{32}S^n_{41} - S^n_{42}S^n_{31}} \quad T^n_{32} = \frac{S^n_{11}S^n_{32} - S^n_{12}S^n_{31}}{S^n_{32}S^n_{41} - S^n_{31}S^n_{42}} \quad T^n_{13} = -T^n_{11}S^n_{33} - T^n_{12}S^n_{43}$$

$$T^n_{23} = -T^n_{21}S^n_{33} - T^n_{22}S^n_{43}$$

$$T^n_{12} = \frac{S_{32}}{S^n_{32}S^n_{41} - S^n_{42}S^n_{31}} \quad T^n_{31} = \frac{S^n_{11} - T^n_{32}S^n_{41}}{S^n_{31}} \quad T^n_{33} = S^n_{13} - T^n_{31}S^n_{33} - T^n_{32}S^n_{43}$$

$$T^n_{43} = S^n_{23} - T^n_{41}S^n_{33} - T^n_{42}S^n_{43}$$

$$T^n_{21} = \frac{S'_{41}}{S^n_{32}S^n_{41} - S^n_{42}S^n_{31}} \quad T^n_{42} = \frac{S^n_{32}S^n_{21} - S^n_{22}S^n_{31}}{S^n_{32}S^n_{41} - S^n_{31}S^n_{42}} \quad T^n_{14} = -T^n_{11}S^n_{34} - T^n_{12}S^n_{44}$$

$$T^n_{24} = -T^n_{21}S^n_{34} - T^n_{22}S^n_{44}$$

$$T^n_{22} = \frac{-S^n_{31}}{S^n_{32}S^n_{41} - S^n_{42}S^n_{31}} \quad T^n_{41} = \frac{S^n_{21} - T^n_{42}S^n_{41}}{S^n_{31}} \quad T^n_{34} = S^n_{14} - T^n_{31}S^n_{34} - T^n_{32}S^n_{44}$$

$$T^n_{44} = S^n_{24} - T^n_{41}S^n_{34} - T^n_{42}S^n_{44},$$

where n specifies a specific one of the one or more balanced four-port networks.

20. The method of claim 12, wherein step (e) includes multiplying the transfer-matrix for the DUT with the inverse of the transfer-matrices for the one or more balanced four-port networks to be de-embedded, in accordance with a relative order of the one or more networks to be de-embedded and the DUT, to thereby produce the composite transfer-matrix.

21. The method of claim 12, wherein step (f) comprises
(f.1) expressing each composite scattering-parameter in terms of composite transfer-parameters of the composite transfer-matrix; and
(f.2) solving for each composite scattering-parameter.

22. The method of claim 12, wherein step (f) comprises generating the set of composite scattering-parameters in accordance with the following equations:

$$S'_{41} = \frac{-T'_{21}}{T'_{11}T'_{22} - T'_{12}T'_{21}}$$

$$S'_{42} = \frac{T'_{11}}{T'_{11}T'_{22} - T'_{12}T'_{21}}$$

$$S'_{31} = \frac{T'_{22}}{T'_{11}T'_{22} - T'_{12}T'_{21}}$$

$$S'_{32} = \frac{-T'_{12}}{T'_{11}T'_{22} - T'_{12}T'_{21}}$$

$$S'_{22} = \frac{T'_{11}T'_{42} - T'_{12}T'_{41}}{T'_{11}T'_{22} - T'_{12}T'_{21}}$$

$$S'_{21} = \frac{T'_{42} - S'_{22}T'_{22}}{T'_{12}}$$

$$S'_{12} = \frac{T'_{11}T'_{32} - T'_{12}T'_{31}}{T'_{11}T'_{22} - T'_{12}T'_{21}}$$

$$S'_{11} = \frac{T'_{32} - S'_{12}T'_{22}}{T'_{12}}$$

$$S'_{13} = T'_{33} - S'_{11}T'_{13} - S'_{12}T'_{33}$$

$$S'_{23} = T'_{43} - S'_{21}T'_{13} - S'_{22}T'_{23}$$

$$S'_{33} = -S'_{31}T'_{13} - S'_{32}T'_{23}$$

$$S'_{43} = -S'_{41}T'_{13} - S'_{42}T'_{23}$$

$$S'_{14} = T'_{34} - S'_{11}T'_{14} - S'_{12}T'_{24}$$

$$S'_{24} = T'_{44} - S'_{21}T'_{14} - S'_{22}T'_{24}$$

$$S'_{34} = -S'_{31}T'_{14} - S'_{32}T'_{24}$$

$$S'_{44} = -S'_{41}T'_{14} - S'_{42}T'_{24},$$

where each $S'_{ji}$ is a composite scattering-parameter of the set of composite-scattering parameters, and each $T'_{ji}$ is a composite transfer-parameter of the composite transfer-matrix.

23. A method for virtually embedding one or more balanced four-port networks into a four-port device under test (DUT) and de-embedding one or more further balanced four-port networks from the DUT, the method comprising the steps of:
(a) acquiring a set of scattering-parameters for the DUT;
(b) generating a transfer-matrix for the DUT based on the set of scattering-parameters for the DUT;
(c) acquiring a set of scattering-parameters for each of the one or more balanced four-port networks to be embedded into the DUT;
(d) generating a corresponding transfer-matrix for each of the one or more balanced four-port networks that is to be embedded into the DUT, each transfer-matrix for being generated based on the corresponding set of scattering-parameters acquired at step (c);

(e) acquiring a set of scattering-parameters for each of the one or more further balanced four-port networks to be de-embedded from the DUT;

(f) generating a corresponding transfer-matrix for each of the one or more further balanced four-port networks that is to be de-embedded from the DUT, each transfer-matrix for being generated based on the corresponding set of scattering-parameters acquired at step (f);

(g) multiplying the transfer-matrix for the DUT with the one or more transfer-matrices generated at step (d) and inverses of the one or more transfer-matrices generated at step (g) to thereby produce a composite transfer-matrix; and (h) generating a set of composite scattering-parameters based on the composite transfer-matrix, the set of composite scattering-parameters being representative the DUT with the one or more balanced four-port networks embedded into it, and the one or more further balanced four-port networks de-embedded from it.

24. A method for virtually embedding one or more balanced four-port networks into a 4k-port device under test (DUT), where k is an integer $\geq 2$, the method comprising the steps of:

(a) acquiring a set of scattering-parameters for the DUT;

(b) generating a transfer-matrix for the DUT based on the set of scattering-parameters for the DUT;

(c) acquiring a set of scattering-parameters for each of the one or more balanced four-port networks to be embedded into the DUT;

(d) generating a corresponding dummy transfer-matrix for each of the one or more balanced four-port networks that is to be embedded into the DUT, each dummy transfer-matrix being a 4k×4k matrix generated based on the corresponding set of scattering-parameters acquired at step (c);

(e) multiplying the transfer-matrix for the DUT with the one or more dummy transfer-matrices generated at step (d) to thereby produce a composite transfer-matrix; and (f) generating a set of composite scattering-parameters based on the composite transfer-matrix, the set of composite scattering-parameters being representative the DUT with the four-port network embedded into it.

25. The method of claim 24, wherein the set of scattering-parameters for the 4k-port DUT includes $(4k)^2$ scattering-parameters.

26. The method of claim 24, wherein step (b) comprises:

(b.1) expressing each transfer-parameter of the transfer-matrix for the DUT in terms of the scattering-parameters for the DUT; and (b.2) solving for each transfer-parameter of the transfer-matrix for the DUT.

27. The method of claim 24, wherein step (d) comprises, for each balanced four-port network of the one or more balanced four-port networks that is to be embedded into the DUT, the following steps:

(d.1) generating a 4×4 sub-transfer-matrix representative of the balanced four-port network;

(d.2) generating two 4×(4k−4) sub-matrices of 0s representing no crosstalk between actual ports of the balanced four-port network and other ports represented within the dummy-matrix;

(d.3) generating a (4k−4)×(4k−4) identity sub-matrix representing the pass throughs for the other ports represented within the dummy matrix;

(d.4) generating a 4k×4k matrix based on the sub-matrices generated at steps (d.1), (d.2) and (d.3), the 4k×4k matrix being the corresponding dummy transfer-matrix for the balanced four-port network.

28. The method of claim 24, wherein step (f) comprises:

(f.1) expressing each composite scattering-parameter in terms of composite transfer-parameters of the composite transfer-matrix; and (f.2) solving for each composite scattering-parameter.

29. A method for virtually de-embedding one or more balanced four-port networks from a 4k-port device under test (DUT), where k is an integer $\geq 2$, the method comprising the steps of:

(a) acquiring a set of scattering-parameters for the DUT;

(b) generating a transfer-matrix for the DUT based on the set of scattering-parameters for the DUT;

(c) acquiring a set of scattering-parameters for each of the one or more balanced four-port networks to be de-embedded from the DUT;

(d) generating a corresponding dummy transfer-matrix for each of the one or more balanced four-port networks that is to be de-embedded from the DUT, each dummy transfer-matrix being a 4k×4k matrix generated based on the corresponding set of scattering-parameters acquired at step (c);

(e) multiplying the transfer-matrix for the DUT with an inverse of each of the one or more dummy transfer-matrices generated at step (d) to thereby produce a composite transfer-matrix; and (f) generating a set of composite scattering-parameters based on the composite transfer-matrix, the set of composite scattering-parameters being representative of the DUT with the one or more four-port networks de-embedded from it.

* * * * *

UNITED STATES PATENT AND TRADEMARK OFFICE
CERTIFICATE OF CORRECTION

PATENT NO. : 6,665,628 B2
DATED : December 16, 2003
INVENTOR(S) : Jon S. Martens It is certified that error appears in the above-identified patent and that said Letters Patent is hereby corrected as shown below:

<u>Column 17,</u>
Line 45, delete "$S'_{13} = T'_{33} - S'_{11} T'_{13} - S'_{12} T'_{33}$" and insert therefor
-- $S'_{13} = T'_{33} - S'_{11} T'_{13} - S'_{12} T'_{23}$ --.

<u>Column 21,</u>
Line 16, between "representative" and "the" insert -- of --.

Signed and Sealed this

Eleventh Day of May, 2004

JON W. DUDAS
*Acting Director of the United States Patent and Trademark Office*